(12) United States Patent
Lee

(10) Patent No.: US 8,823,409 B2
(45) Date of Patent: Sep. 2, 2014

(54) SEMICONDUCTOR APPARATUS AND METHOD OF TESTING AND MANUFACTURING THE SAME

(75) Inventor: Tae Yong Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 636 days.

(21) Appl. No.: 12/982,849

(22) Filed: Dec. 30, 2010

(65) Prior Publication Data

US 2012/0105093 A1    May 3, 2012

(30) Foreign Application Priority Data

Oct. 29, 2010 (KR) ........................ 10-2010-0106806

(51) Int. Cl.
| H01L 23/48 | (2006.01) |
| H01L 21/66 | (2006.01) |
| H01L 25/00 | (2006.01) |
| G01R 31/28 | (2006.01) |
| H01L 25/065 | (2006.01) |
| H01L 23/00 | (2006.01) |

(52) U.S. Cl.
CPC ............ H01L 25/0657 (2013.01); H01L 22/32 (2013.01); *H01L 2225/06517* (2013.01); *H01L 2924/15311* (2013.01); *H01L 2224/13025* (2013.01); *H01L 2225/06596* (2013.01); H01L 25/50 (2013.01); *H01L 2225/06513* (2013.01); *H01L 2225/06541* (2013.01); *H01L 2224/16227* (2013.01); H01L 23/481 (2013.01); *H01L 24/16* (2013.01); G01R 31/2853 (2013.01); *H01L 24/13* (2013.01); *H01L 2224/16145* (2013.01)
USPC ................... 324/762.01; 324/762.06; 257/48; 257/E23.011

(58) Field of Classification Search
CPC ........ G01R 31/26; G01R 29/10; G11C 29/52; H01L 23/48
USPC ............. 324/762.01, 762.02, 762.05, 762.06; 438/11–18; 257/48–57, 773–777
See application file for complete search history.

(56) References Cited

U.S. PATENT DOCUMENTS

| 4,591,902 | A | * | 5/1986 | Masubuchi | .................... 348/791 |
| 4,782,283 | A | * | 11/1988 | Zasio | .............................. 714/726 |
| 5,457,381 | A | * | 10/1995 | Farwell | ....................... 324/750.3 |
| 6,563,300 | B1 | * | 5/2003 | Jackson et al. | ............ 324/750.15 |

(Continued)

FOREIGN PATENT DOCUMENTS

| JP | 2004264057 A | 9/2004 |
| JP | 2005-310946 | 11/2005 |

*Primary Examiner* — Arleen M Vazquez
*Assistant Examiner* — Robert P Alejnikov, Jr.
(74) *Attorney, Agent, or Firm* — William Park & Associates Ltd.

(57) ABSTRACT

A semiconductor apparatus includes: a semiconductor chip, wherein a conductive layer is formed at one side of the semiconductor chip and one or more of probe pads are formed at the other side thereof; a plurality of through-silicon vias (TSVs), wherein one side of each of the plurality of TSVs is coupled to the conductive layer and the other side of one or more of the plurality of TSVs is coupled to the probe pad; a plurality of latch units each configured to be assigned to the plurality of corresponding TSVs and store a test signal, wherein the test signal is inputted via the probe pad and is transferred via the plurality of corresponding TSVs to the plurality of assigned latch units, respectively; and a signal combination unit configured to combine a plurality of signals stored in the plurality of latch units to output the result as an error detection signal.

17 Claims, 4 Drawing Sheets

(56) References Cited

U.S. PATENT DOCUMENTS

| | | | |
|---|---|---|---|
| 7,098,878 B2* | 8/2006 | Udo et al. | 345/87 |
| 7,439,751 B2* | 10/2008 | Kuo et al. | 324/754.01 |
| 8,243,485 B2* | 8/2012 | Jin et al. | 365/51 |
| 2003/0011376 A1* | 1/2003 | Matsushita et al. | 324/500 |
| 2007/0051949 A1 | 3/2007 | Schneider et al. | |
| 2007/0252612 A1* | 11/2007 | Sylvester | 324/765 |
| 2008/0290341 A1 | 11/2008 | Shibata | |
| 2009/0085590 A1* | 4/2009 | Berry et al. | 324/754 |
| 2009/0153177 A1 | 6/2009 | Shibata | |
| 2010/0012934 A1 | 1/2010 | Jung | |
| 2010/0181661 A1 | 7/2010 | Takemoto et al. | |
| 2010/0255614 A1 | 10/2010 | Uchida | |
| 2011/0309519 A1* | 12/2011 | Kim | 257/774 |

\* cited by examiner

SEMICONDUCTOR APPARATUS AND METHOD OF TESTING AND MANUFACTURING THE SAME

CROSS-REFERENCES TO RELATED APPLICATION

The present application claims priority to Korean application number 10-2010-0106806, filed on Oct. 29, 2010, which is incorporated by reference in its entirety.

BACKGROUND OF THE INVENTION

1. Technical Field

Embodiments relate to a semiconductor apparatus, and more particularly, to a technique for testing a through-chip via and manufacturing the semiconductor apparatus based on the test result.

2. Related Art

In general, various package schemes have recently been proposed so as to highly integrate a semiconductor apparatus. Specifically, a chip stack scheme where a plurality of semiconductor chips are stacked one on top of another to constitute a single semiconductor apparatus uses a through-chip via so as to commonly transfer a signal to the plurality of semiconductor chips. In general, the through-chip via is referred to as a though-silicon via (TSV) because the semiconductor chip is generally manufactured with a silicon wafer.

In addition, the plurality of stacked semiconductor chips can be classified into a master chip and one or more slave chips. The master chip is configured to perform an operation for communicating a signal with the outside and controlling the slave chip. And, the one or more slave chips are each configured to perform a specific operation under the control of the master chip. For example, in case of the semiconductor memory apparatus, the master chip includes a peripheral circuit related to a control signal and an input/output operation of a signal, and the slave chip includes a memory bank configured to store data. For reference, such a circuit configuration assigned to the master chip and the slave chip can be varied according to needs.

FIG. 1 is a diagram showing a configuration of a conventional semiconductor apparatus 1 where a plurality of semiconductor chips are stacked one on top of another.

Referring to FIG. 1, the semiconductor apparatus 1 comprises four semiconductor chips CHIP1, CHIP2, CHIP3 and CHIP4 which are stacked on a package substrate PKG SUB. A plurality of through-silicon vias (TSVs) are formed through each of the semiconductor chips CHIP1, CHIP2, CHIP3 and CHIP4, and each of the plurality of TSVs is coupled to the TSV of the adjacent semiconductor chip through a bump BUMP.

During a test process for the semiconductor apparatus, a test is performed to detect whether or not the TSV is defective. In general, the test is performed on the TSV after all of the plurality of semiconductor chips are stacked together. When a TSV in a specific one of the plurality of semiconductor chips is detected to be defective and judged to be irreparable, the plurality of stacked semiconductor chips are substantially unusable and needs to be discarded.

SUMMARY OF THE INVENTION

The embodiments of the present invention include a semiconductor apparatus capable of effectively and quickly performing a test on a through-silicon via (TSV) and a method of testing the same.

In addition, the embodiments of the present invention include a method of manufacturing the semiconductor apparatus, capable of detecting a defect of the TSV included in each of a plurality of semiconductor chips before all of the plurality of semiconductor chips are stacked one on top of another and thereby reducing a manufacturing cost.

In one embodiment of the present invention, a semiconductor apparatus includes: a semiconductor chip, wherein a conductive layer is formed at one side of the semiconductor chip and one or more of probe pads are formed at the other side thereof; a plurality of through-silicon vias (TSVs), wherein one side of each of the plurality of TSVs is coupled to the conductive layer and the other side of one or more of the plurality of TSVs is coupled to the probe pad; a plurality of latch units each configured to be assigned to the plurality of corresponding TSVs and store a test signal, wherein the test signal is inputted via the probe pad and is transferred via the plurality of corresponding TSVs to the plurality of assigned latch units, respectively; and a signal combination unit configured to combine a plurality of signals stored in the plurality of latch units to output the result as an error detection signal.

In another embodiment of the present invention, a semiconductor apparatus includes: a semiconductor chip, wherein a conductive layer is formed at one side of the semiconductor chip and one or more of probe pads are formed at the other side thereof; a plurality of through-silicon vias (TSVs), wherein one side of each of the plurality of TSVs is coupled to the conductive layer and the other side of one or more of the plurality of TSVs is coupled to the probe pad; and a shift register configured to store a test signal configured to be inputted via the probe pad and be transferred via the plurality of TSVs under control of a clock signal, respectively.

In still another embodiment of the present invention, a test method of a semiconductor apparatus, including: a semiconductor chip, wherein a conductive layer is formed at one side of the semiconductor chip and one or more of probe pads are formed at the other side thereof; and a plurality of through-silicon vias (TSVs), wherein one side of each of the plurality of TSVs is coupled to the conductive layer and the other side of one or more of the plurality of TSVs is coupled to the probe pad, comprises: initializing a plurality of latch units configured to be assigned to the plurality of TSVs, respectively; inputting a test signal via a first probe pad; storing the test signal transferred via the plurality of TSVs in the plurality of assigned latch units, respectively; and combining a plurality of signals stored in the plurality of latch units to generate an error detection signal and outputting the result via a second probe pad.

In still another embodiment of the present invention, a test method of a semiconductor apparatus, including: a semiconductor chip, wherein a conductive layer is formed at one side of the semiconductor chip and one or more of probe pads are formed at the other side thereof; and a plurality of through-silicon vias (TSVs), wherein one side of each of the plurality of TSVs is coupled to the conductive layer and the other side of one or more of the plurality of TSVs is coupled to the probe pad, comprises: initializing a shift register configured to store a signal transferred via the plurality of TSVs; inputting a test signal via a first probe pad; storing the test signal transferred via the plurality of TSVs in the shift register under control of a clock signal, respectively; and outputting a signal sequentially transferred in the shift register via a second probe pad.

In still another embodiment of the present invention, a manufacturing method of a semiconductor apparatus comprises: forming a conductive layer at one side of a first semiconductor chip configured to have a plurality of through-silicon vias (TSVs) therein and electrically coupling one side of the plurality of TSVs with each other; initializing a plurality of latch units configured to be assigned to the plurality of TSVs, respectively; inputting a test signal via a first probe pad configured to be coupled to the other side of one or more of the plurality of TSVs and be formed at the other side of the first semiconductor chip; storing the test signal transferred via the plurality of TSVs in the plurality of assigned latch units, respectively; combining a plurality of signals stored in the plurality of latch units to generate an error detection signal and outputting the result via a second probe pad configured to be formed at the other side of the first semiconductor chip; eliminating the conductive layer configured to be formed at the one side of the first semiconductor chip; and stacking the first semiconductor chip and the second semiconductor chip wherein the test is completed one on top of the other and thereby coupling the plurality of TSVs of the first semiconductor chip and the plurality of TSVs of the second semiconductor chip with each other.

BRIEF DESCRIPTION OF THE DRAWINGS

Features, aspects, and embodiments are described in conjunction with the attached drawings, in which.

DETAILED DESCRIPTION OF THE PREFERRED EMBODIMENTS

Hereinafter, preferred embodiments of the present invention will be described in detail with reference to the accompanying drawings so that the invention can easily be practiced by those skilled in the art to which the invention pertains.

Figure 1:
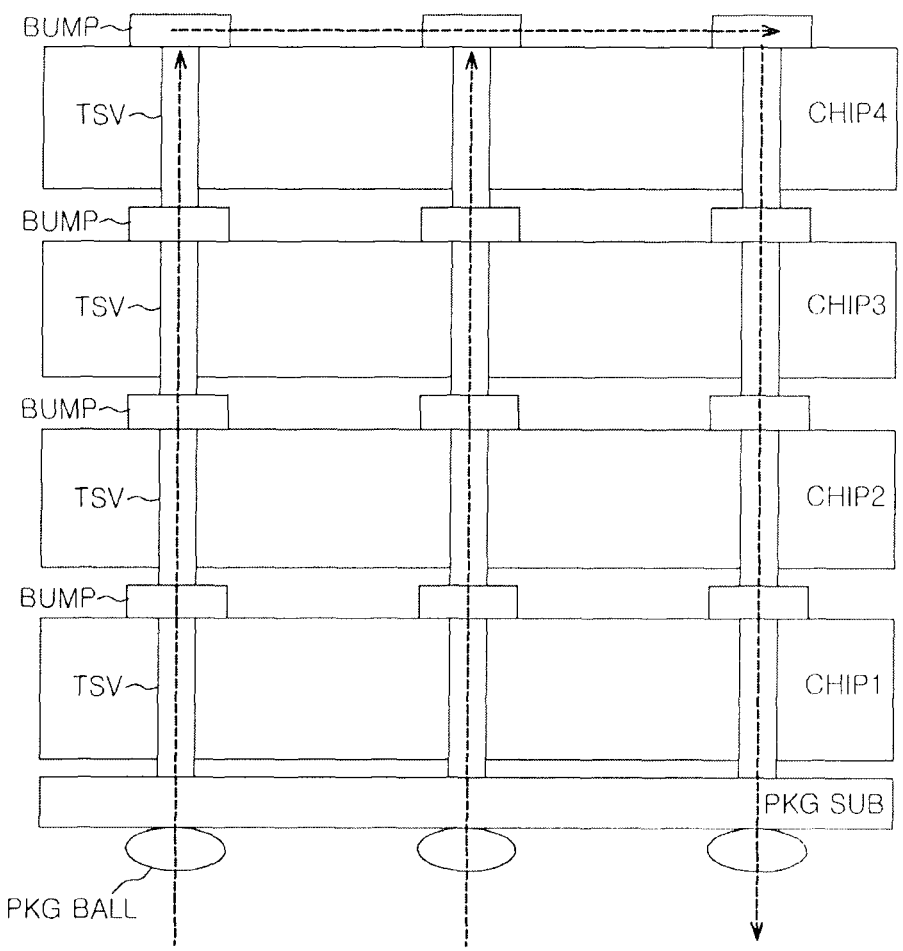
FIG. 1 is a diagram showing a configuration of a conventional semiconductor apparatus where a plurality of semiconductor chips are stacked one on top of another.
Figure 2:
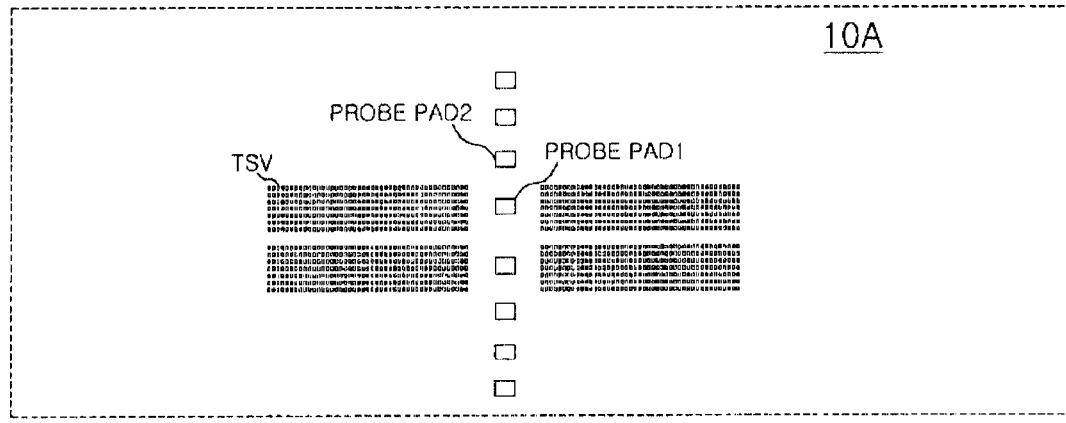
FIG. 2 is a conceptual diagram showing a configuration of a semiconductor apparatus according to an embodiment of the invention.
Figure 2:
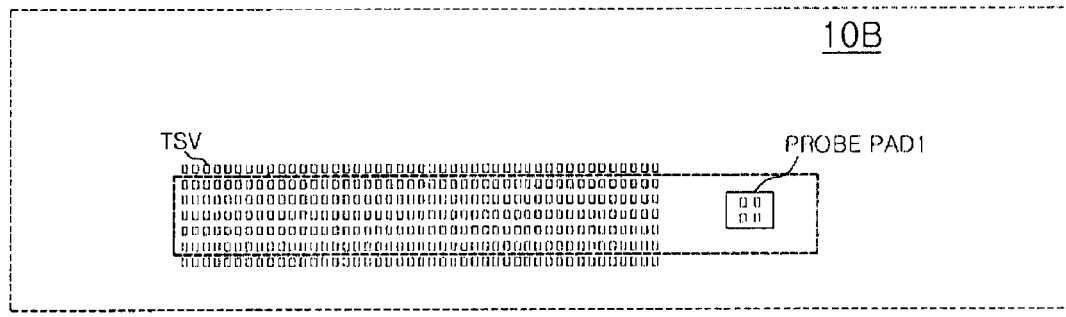
Figure 2:
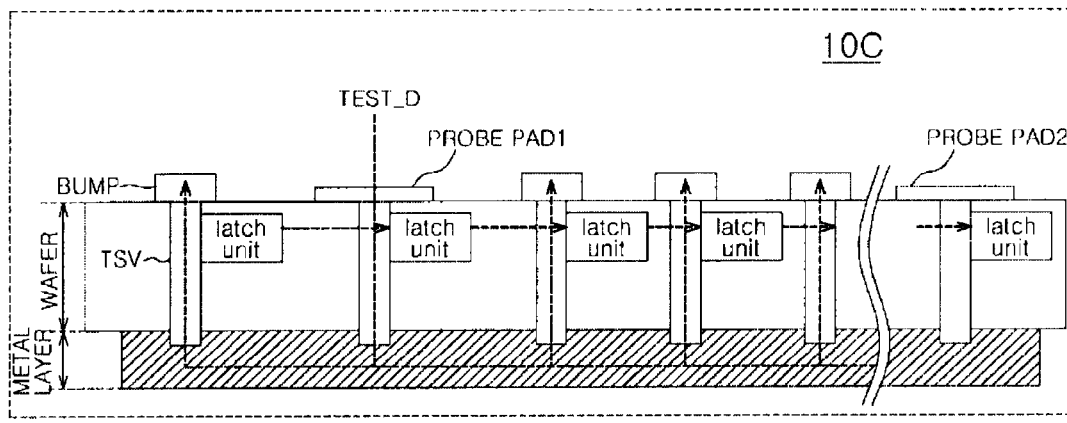

FIG. 2 is a conceptual diagram showing a configuration of a semiconductor apparatus according to an embodiment of the invention.

The semiconductor apparatus in accordance with the present embodiment of the invention includes only a simplified configuration for the sake of clear description.

Referring to FIG. 2, a first conceptual diagram 10A is a diagram schematically showing a top plan view of the semiconductor apparatus which includes a plurality of through-silicon vias (TSVs), and a second conceptual diagram 10B is an enlarged diagram showing a part of the first conceptual diagram 10A.

In general, when testing a semiconductor apparatus, an input/output pin PIN and the like of test equipment is coupled to a probe pad PROBE PAD to apply a particular signal to the semiconductor apparatus, and then read back a result. However, since the through-silicon via (TSV) is very small, it is difficult to directly connect the input/output pin PIN of the test equipment to the TSV. Therefore, a probe pad PROBE PAD is coupled to the TSV, and then a particular signal is applied and a particular result is read back via the probe pad PROBE PAD. In order to improve a reliability of a signal transmission, one or more of the TSVs are coupled to the probe pad PROBE PAD in parallel. The second conceptual diagram 10B shows an example where four TSVs are coupled to a first probe pad PROBE PAD1.

Referring to a third conceptual diagram 10C of FIG. 2, the semiconductor apparatus includes a semiconductor chip (i.e., a wafer WAFER), a plurality of TSVs, and a plurality of latch units.

In the diagram 10C, a conductive layer is formed at one side of the wafer WAFER, whereas one or more of probe pads are formed at the other side thereof. In the exemplary embodiment, the conductive layer is formed through a metal layer METAL LAYER, and two pads, i.e., the first probe pad PROBE PAD1 and a second probe pad PROBE PAD2, are formed.

One side of each of the plurality of TSVs is coupled to the metal layer METAL LAYER, and the other side of one or more of the plurality of TSVs is coupled to the first probe pad PROBE PAD1 or the second probe pad PROBE PAD2. Therefore, if a particular test signal 'TEST_D' is applied via the first probe pad PROBE PAD1, the test signal 'TEST_D' is transferred to all of the plurality of TSVs via the metal layer METAL LAYER.

The plurality of latch units are assigned to the plurality of TSVs, respectively, and each of the plurality of latch units stores the test signal 'TEST_D' which is inputted via the first probe pad PROBE PAD1 and then transferred to the assigned latch unit via the corresponding TSV. In addition, the plurality of latch units are each initialized to a level opposite to a level of the test signal 'TEST_D' before the test signal 'TEST_D' is inputted. Therefore, if the TSV is formed normally, data in the latch unit assigned to the normal TSV is inverted, whereas if the TSV is defective, data in the latch unit assigned to the defective TSV substantially maintains its initial level. Therefore, it is possible to combine a plurality of signals stored in the plurality of latch units after the test signal 'TEST_D' is transferred and detect whether or not there are one or more of defective TSVs among the plurality of TSVs based on the combination result, and furthermore it is possible to sequentially output the signal stored in the plurality of latch units and detect which one is defective among the plurality of TSVs based on the outputted result.

Figure 3:
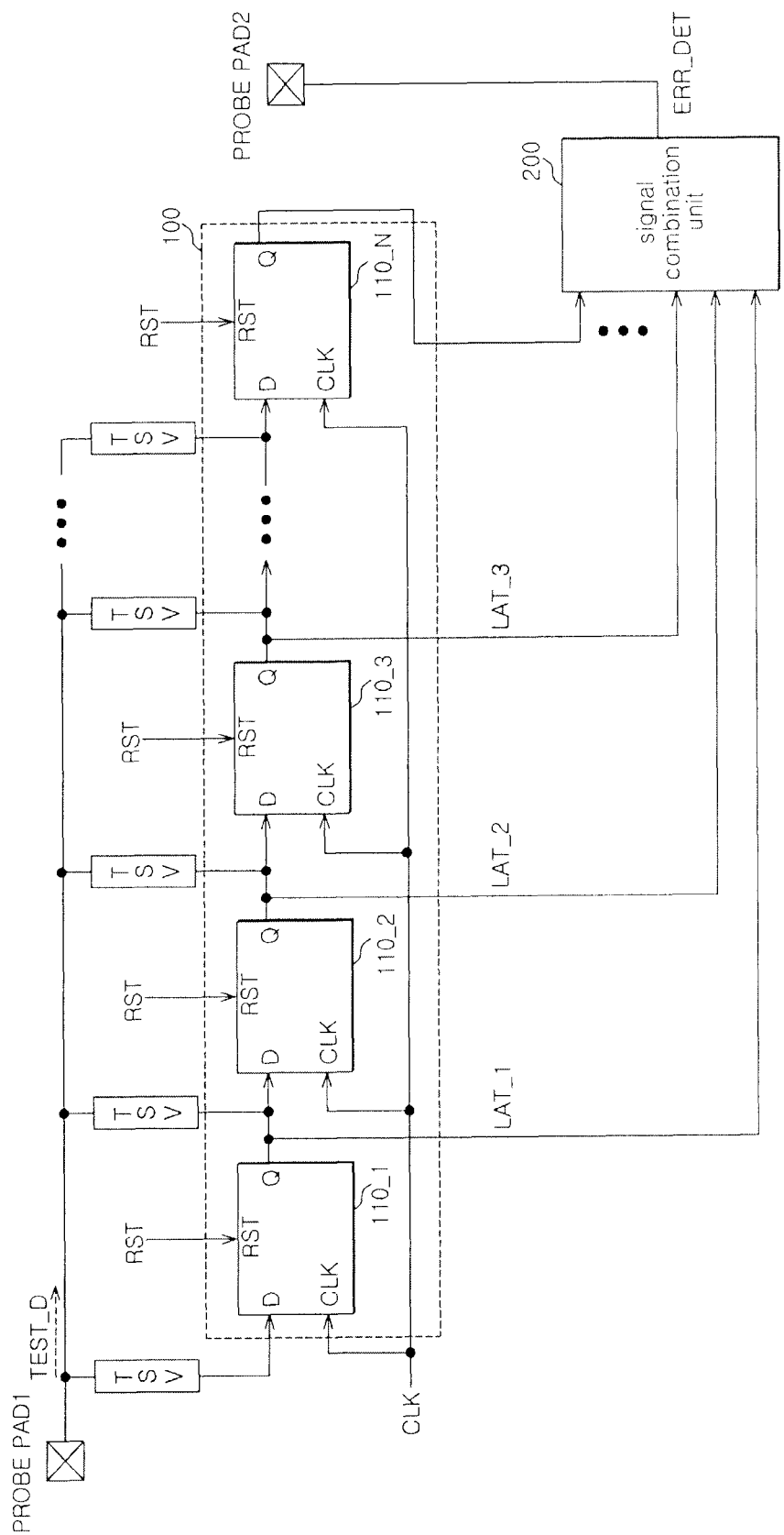
FIG. 3 is a detailed diagram showing a configuration of the semiconductor apparatus of FIG. 2 according to a first exemplary embodiment of the invention.

FIG. 3 is a detailed diagram showing a configuration of the semiconductor apparatus of FIG. 2 according to a first exemplary embodiment.

The semiconductor apparatus in accordance with the present embodiment of the invention includes only a simplified configuration for the sake of clear description.

Referring to FIGS. 2 and 3, the semiconductor apparatus includes a plurality of TSVs penetrating the semiconductor chip (i.e., the wafer WAFER), a first probe pad PROBE PAD1, a second probe pad PROBE PAD2, a plurality of latch units 110_1 to 110_N, and a signal combination unit 200. In this embodiment, the plurality of latch units 110_1 to 110_N are coupled to form a shift register 100. A conductive layer is formed at one side of the semiconductor chip, whereas the first and second probe pads PROBE PAD1 and PROBE PAD2 are formed at the other side.

In addition, one side of each of the plurality of TSVs is coupled to the conductive layer, and the other side of one or more of the plurality of TSVs are coupled to the first probe pad PROBE PAD1 or the second probe pad PROBE PAD2. Therefore, if the test signal 'TEST_D' is applied via the first probe pad PROBE PAD1, the test signal 'TEST_D' is transferred to all of the plurality of TSVs via the conductive layer.

The plurality of latch units 110_1 to 110_N are assigned to the plurality of TSVs, respectively, and each of the plurality of latch units stores the test signal 'TEST_D' which is transferred to the assigned latch unit via the corresponding TSV.

The plurality of latch units 110_1 to 110_N are each initialized to a level opposite to a level of the test signal 'TEST_D' before the test signal 'TEST_D' is inputted. Therefore, if the TSV is formed normally, data in the latch unit assigned to the normal TSV is inverted, whereas if the TSV is defective, data in the latch unit assigned to the defective TSV substantially maintains its initial level.

In this embodiment, the semiconductor apparatus is configured such that each of the plurality of latch units 110_1 to 110_N stores a signal under control of a clock signal 'CLK'. For reference, in some alternative implementations, each of the plurality of latch units 110_1 to 110_N can be implemented with a digital latch which stores a logic level of the test signal 'TEST_D', and also can be implemented with an analog latch which compares a reference voltage with a voltage level of the test signal 'TEST_D' and stores a value corresponding to the comparison result. If the analog latch is used, it is possible to set the value which will be stored in the latch unit by adjusting the voltage level of the test signal 'TEST_D'.

The signal combination unit 200 combines the plurality of signals stored in the plurality of latch units 110_1 to 110_N to output the result as an error detection signal 'ERR_DET'. The signal combination unit 200 can be implemented with a logic unit that logically ANDs all the signals stored in the plurality of latch units 110_1 to 110_N or a logic unit that logically ORs all the signals stored in the plurality of latch units 110_1 to 110_N.

For example, if the signal combination unit 200 is implemented with the logic unit that logically ANDs all the signals stored in the plurality of latch units 110_1 to 110_N, it is preferable that the level of the test signal 'TEST_D' is set to a logic high level and the initial level of each of the plurality of latch units 110_1 to 110_N is set to a logic low level. That is, if one or more of the plurality of signals stored in the plurality of latch units 110_1 to 110_N maintain the logic low level, it indicates that one or more of the plurality of TSVs are defective, thereby the error detection signal 'ERR_DET' of a logic low level is outputted.

On the other hand, if the signal combination unit 200 is implemented with the logic unit that logically ORs all the signals stored in the plurality of latch units 110_1 to 110_N, it is preferable that the level of the test signal 'TEST_D' is set to a logic low level and the initial level of each of the plurality of latch units 110_1 to 110_N is set to a logic high level. That is, if one or more of the plurality of signals stored in the plurality of latch units 110_1 to 110_N maintain the logic high level, it indicates that one or more of the plurality of TSVs are defective, thereby the error detection signal 'ERR_DET' of a logic high level is outputted.

In an embodiment of FIG. 3, the semiconductor apparatus is implemented such that the test signal 'TEST_D' is inputted via the first probe pad PROBE PAD1 and the error detection signal 'ERR_DET' is outputted via the second probe pad PROBE PAD2. However, according to test equipment or a test method, the semiconductor apparatus can also be implemented such that the test signal 'TEST_D' is inputted and the error detection signal 'ERR_DET' is outputted via a common probe pad.

In short, in this configuration, a test method of the semiconductor apparatus comprises: initializing the plurality of latch units configured to be assigned to the plurality of TSVs, respectively; inputting the test signal via the first probe pad; storing the test signal transferred via the plurality of TSVs in the plurality of assigned latch units, respectively; and combining the plurality of signals stored in the plurality of latch units to generate the error detection signal and outputting the result via the second probe pad.

It may be noted in FIG. 3 that signal contention may exist as drawn between a signal from a previous latch unit and a signal from a TSV. However, as stated previously, only a simplified circuitry has been drawn. Inputs to each of the latch units 110_2 to 110_N may be selected from either the signal from the corresponding previous latch unit or the signal from the corresponding TSV. Various methods may be used to implement the selection of an input to a latch unit.

Figure 4:
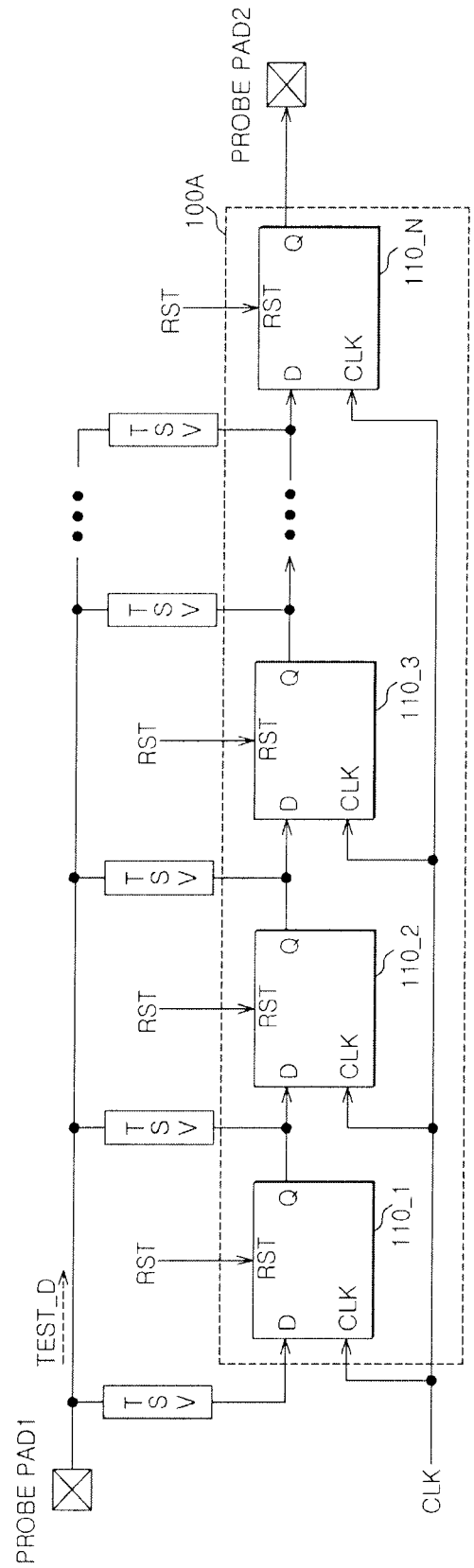
FIG. 4 is a detailed diagram showing a configuration of the semiconductor apparatus of FIG. 2 according to a second exemplary embodiment of the invention.

FIG. 4 is a detailed diagram showing a configuration of the semiconductor apparatus of FIG. 2 according to a second exemplary embodiment.

The semiconductor apparatus in accordance with the present embodiment of the invention includes only a simplified configuration for the sake of clear description.

Referring to FIGS. 2 and 4, the semiconductor apparatus includes a plurality of TSVs penetrating the semiconductor chip (i.e., the wafer WAFER), a first probe pad PROBE PAD1, a second probe pad PROBE PAD2, and a shift register 100A. In this embodiment, the plurality of latch units 110_1 to 110_N are coupled to form the shift register 100A. The conductive layer is formed on one side of the semiconductor chip, whereas the first and second probe pads PROBE PAD1 and PROBE PAD2 are formed at the other side thereof.

In addition, one side of each of the plurality of TSVs is coupled to the conductive layer, and the other side of one or more of the plurality of TSVs are coupled to the first probe pad PROBE PAD1 or the second probe pad PROBE PAD2. Therefore, if a test signal 'TEST_D' is applied via the first probe pad PROBE PAD1, the test signal 'TEST_D' is transferred to all of the plurality of TSVs via the conductive layer.

The shift register 100A stores the test signal 'TEST_D' which is inputted via the first probe pad PROBE PAD1 and transferred via the plurality of TSVs under control of a clock signal 'CLK'. The plurality of latch units 110_1 to 110_N constituting the shift register 100A are initialized to a level opposite to a level of the test signal 'TEST_D' before the test signal 'TEST_D' is inputted. Therefore, if the TSV is formed normally, data in the latch unit assigned to the normal TSV is inverted, whereas if the TSV is defective, data in the latch unit assigned to the defective TSV substantially maintains its initial level.

In this embodiment, the semiconductor apparatus is configured such that each of the plurality of latch units 110_1 to 110_N stores and shifts a signal under the control of the clock signal 'CLK'. For reference, in some alternative implementations, each of the plurality of latch units can be implemented with a digital latch which stores a logic level of the test signal 'TEST_D', and also can be implemented with an analog latch which compares a reference voltage with a voltage level of the test signal 'TEST_D' and stores a value corresponding to the comparison result. At this time, if the analog latch is used, it is possible to set the value which will be stored in the latch unit by adjusting the voltage level of the test signal 'TEST_D'.

The semiconductor apparatus of FIG. 4 can sequentially output the signal stored in the plurality of latch units 110_1 to 110_N, and can detect which one is defective among the plurality of TSVs based on the outputted result.

In an embodiment of FIG. 4, the semiconductor apparatus is implemented to receive the test signal 'TEST_D' via the first probe pad PROBE PAD1 and output the signal sequentially transferred in the shift register 100A via the second probe pad PROBE PAD2. However, according to test equipment or a test method, the semiconductor apparatus can also be implemented such that the test signal 'TEST_D' is inputted and the signal transferred in the shift register 100A is outputted via a common probe pad.

In short, in this configuration, a test method of the semiconductor apparatus comprises: initializing the shift register configured to store the signal transferred via the plurality of TSVs; inputting the test signal via the first probe pad; storing the test signal transferred via the plurality of TSVs in the shift register under the control of the clock signal, respectively; and outputting the signal sequentially transferred in the shift register via the second probe pad.

In an embodiment of the invention, the semiconductor is manufactured using a manufacturing method that defective TSVs in the semiconductor chips are detected before the semiconductor chips are stacked together. Accordingly, a plurality of semiconductor chips with no TSV defect are stacked together.

As stated before, it may be noted in FIG. 3 that signal contention may exist as drawn between a signal from a previous latch unit and a signal from a TSV. However, only a simplified circuitry has been drawn. Inputs to each of the latch units 110_2 to 110_N may be selected from either the signal from the corresponding previous latch unit or the signal from the corresponding TSV. Various methods may be used to implement the selection of an input to a latch unit.

That is, according to various embodiment of the invention, the manufacturing method of the semiconductor apparatus comprises: forming the conductive layer at one side of a first semiconductor chip through which the plurality of TSVs are formed and electrically coupling the one side of the plurality of TSVs with each other; initializing the plurality of latch units configured to be assigned to the plurality of TSVs, respectively; inputting the test signal via the first probe pad configured to be coupled to the other side of one or more of the plurality of TSVs and be formed at the other side of the first semiconductor chip; storing the test signal transferred via the plurality of TSVs in the plurality of assigned latch units, respectively; combining the plurality of signals stored in the plurality of latch units to generate the error detection signal and outputting the result via the second probe pad configured to be formed at the other side of the first semiconductor chip; eliminating the conductive layer configured to be formed at the one side of the first semiconductor chip; and stacking the first semiconductor chip and a second semiconductor chip where the test is completed one on top of the other and thereby coupling the plurality of TSVs of the first semiconductor chip and the plurality of TSVs of the second semiconductor chip with each other.

While certain embodiments have been described above, it will be understood to those skilled in the art that the embodiments described are by way of example only. Accordingly, the device and method described herein should not be limited based on the described embodiments. Rather, the apparatus described herein should only be limited in light of the claims that follow when taken in conjunction with the above description and accompanying drawings.

What is claimed is:

1. A semiconductor apparatus comprising:
   a semiconductor chip, wherein a conductive layer is formed at one side of the semiconductor chip and one or more of probe pads are formed at the other side thereof;
   a plurality of through-silicon vias (TSVs), wherein one side of each of the plurality of TSVs is coupled to the conductive layer and the other side of one or more of the plurality of TSVs is coupled to the probe pad;
   a plurality of latch units each configured to be assigned to the plurality of corresponding TSVs and store a test signal, wherein the test signal is inputted via the probe pad and is transferred via the plurality of corresponding TSVs to the plurality of assigned latch units, respectively; and
   a signal combination unit configured to combine a plurality of signals stored in the plurality of latch units to output the result as an error detection signal.

2. The semiconductor apparatus of claim 1, wherein the test signal is inputted via a first probe pad and the error detection signal is outputted via a second probe pad.

3. The semiconductor apparatus of claim 1, wherein the plurality of latch units each is configured to store the signal under control of a clock signal.

4. The semiconductor apparatus of claim 1, wherein a signal level of the test signal is opposite to an initial level of the plurality of latch units.

5. The semiconductor apparatus of claim 1, wherein the plurality of latch units each is implemented with a digital latch configured to store a logic level of the test signal.

6. The semiconductor apparatus of claim 1, wherein the plurality of latch units each is implemented with an analog latch configured to compare a reference voltage with a voltage level of the test signal and store a value corresponding to the comparison result.

7. The semiconductor apparatus of claim 1, wherein the signal comparison unit includes a logic unit configured to logically add all of the signals stored in the plurality of latch units and output the result as the error detection signal.

8. The semiconductor apparatus of claim 1, wherein the signal comparison unit includes a logic unit configured to logically multiply(AND) all of the signals stored in the plurality of latch units and output the result as the error detection signal.

9. A semiconductor apparatus comprising:
   a semiconductor chip, wherein a conductive layer is formed at one side of the semiconductor chip and one or more of probe pads are formed at the other side thereof;
   a plurality of through-silicon vias (TSVs), wherein one side of each of the plurality of TSVs is coupled to the conductive layer and the other side of one or more of the plurality of TSVs is coupled to the probe pad; and
   a shift register configured to store a test signal configured to be inputted via the probe pad and be transferred via the plurality of TSVs under control of a clock signal, respectively,
   wherein the shift register is implemented with a plurality of analog latches each configured to compare a reference voltage with a voltage level of the test signal and store a value corresponding to the comparison result.

10. The semiconductor apparatus of claim 9, wherein the test signal is inputted via a first probe pad and a signal sequentially transferred in the shift register is outputted via a second probe pad.

11. The semiconductor apparatus of claim 9, wherein a signal level of the test signal is opposite to an initial level of the shift register.

12. The semiconductor apparatus of claim 9, wherein the shift register is implemented with a plurality of digital latches each configured to store a logic level of the test signal.

13. A test method of a semiconductor apparatus including:
   a semiconductor chip, wherein a conductive layer is formed at one side of the semiconductor chip and one or more of probe pads are formed at the other side thereof; and a plurality of through-silicon vias (TSVs), wherein one side of each of the plurality of TSVs is coupled to the conductive layer and the other side of one or more of the plurality of TSVs is coupled to the probe pad, the test method comprising:

initializing a plurality of latch units configured to be assigned to the plurality of TSVs, respectively;

inputting a test signal via a first probe pad;

storing the test signal transferred via the plurality of TSVs in the plurality of assigned latch units, respectively; and combining a plurality of signals stored in the plurality of latch units to generate an error detection signal and outputting the result via a second probe pad.

14. The method of claim 13, wherein the plurality of latch units each is configured to store a signal under control of a clock signal.

15. The method of claim 13, wherein a signal level of the test signal is opposite to an initial level of the plurality of latch units.

16. A test method of a semiconductor apparatus including:

a semiconductor chip, wherein a conductive layer is formed at one side of the semiconductor chip and one or more of probe pads are formed at the other side thereof; and a plurality of through-silicon vias (TSVs), wherein one side of each of the plurality of TSVs is coupled to the conductive layer and the other side of one or more of the plurality of TSVs is coupled to the probe pad, the test method comprising:

initializing a shift register configured to store a signal transferred via the plurality of TSVs;

inputting a test signal via a first probe pad;

storing the test signal transferred via the plurality of TSVs in the shift register under control of a clock signal, respectively; and outputting a signal sequentially transferred in the shift register via a second probe pad.

17. The method of claim 16, wherein a signal level of the test signal is opposite to an initial level of the shift register.

* * * * *